United States Patent
Gati et al.

(10) Patent No.: US 8,884,615 B2
(45) Date of Patent: Nov. 11, 2014

(54) MAGNETORESISTIVE SENSOR ARRANGEMENT FOR CURRENT MEASUREMENT

(75) Inventors: Rudolf Gati, Wettingen (CH); Markus Abplanalp, Baden-Dättwil (CH)

(73) Assignee: ABB Research Ltd., Zürich (CH)

( * ) Notice: Subject to any disclaimer, the term of this patent is extended or adjusted under 35 U.S.C. 154(b) by 572 days.

(21) Appl. No.: 13/003,858

(22) PCT Filed: Jul. 22, 2008

(86) PCT No.: PCT/EP2008/059609
§ 371 (c)(1),
(2), (4) Date: Feb. 8, 2011

(87) PCT Pub. No.: WO2010/009761
PCT Pub. Date: Jan. 28, 2010

(65) Prior Publication Data
US 2011/0121828 A1    May 26, 2011

(51) Int. Cl.
*G01R 33/09* (2006.01)
*G01R 19/00* (2006.01)
*B82Y 25/00* (2011.01)
*G01R 15/20* (2006.01)

(52) U.S. Cl.
CPC ............... *G01R 33/093* (2013.01); *B82Y 25/00* (2013.01); *G01R 15/205* (2013.01)
USPC .......................................... 324/252; 324/713

(58) Field of Classification Search
USPC ........................................................ 324/252
See application file for complete search history.

(56) References Cited

U.S. PATENT DOCUMENTS

| | | |
|---|---|---|
| 2003/0151406 A1 | 8/2003 | Wan et al. |
| 2005/0156587 A1 | 7/2005 | Yakymyshyn et al. |
| 2007/0076332 A1 | 4/2007 | Shoji et al. |
| 2008/0100290 A1 | 5/2008 | Shoji |

FOREIGN PATENT DOCUMENTS

| | | | |
|---|---|---|---|
| EP | 0294636 | | 12/1988 |
| EP | 1406094 A1 | * | 4/2004 |
| WO | 2006042839 | | 4/2006 |
| WO | 2010009761 | | 1/2010 |

OTHER PUBLICATIONS

Abstract of EP 1406094 A1, Apr. 2004.*
Partial Translation of EP 1406094 A1, Apr. 2004.*
Ripka P "Alternating Current-Excited Magnetoresistive Sensor" Journal of Applied Physics, American Institute of Physics. New York, US, vol. 79 No. 8, Part 02A, 5211-5213, XP000695736, year 1996.
Pavel Ripka et al. "Advances in magnetic sensors" Sensors, 2008 IEEE, IEEE, Piscataway, NJ, US, Oct. 26, 2008, pp. 1-4, XP031375006.

* cited by examiner

*Primary Examiner* — Bot Ledynh
(74) *Attorney, Agent, or Firm* — Robert P. Nupp; Denis Ticak

(57) ABSTRACT

A sensor unit for the measurement of a current in a conductor (1) comprising at least one magnetoresistive sensor (5, 6) located at a radial distance from the outer surface of the conductor (1) is disclosed, wherein the conductor (1) has a circular cross-section, and wherein it comprises at least one auxiliary coil (7) for the generation of a bias magnetic field ($H_{bias}$) to the magnetoresistive sensor (5, 6) strong enough for inducing magnetic saturation in the magnetoresistive sensor (5, 6) continuously during the whole current measurement process. Further the use of such a sensor and a method for measuring the current in the conductor using such a sensor unit are disclosed.

17 Claims, 7 Drawing Sheets

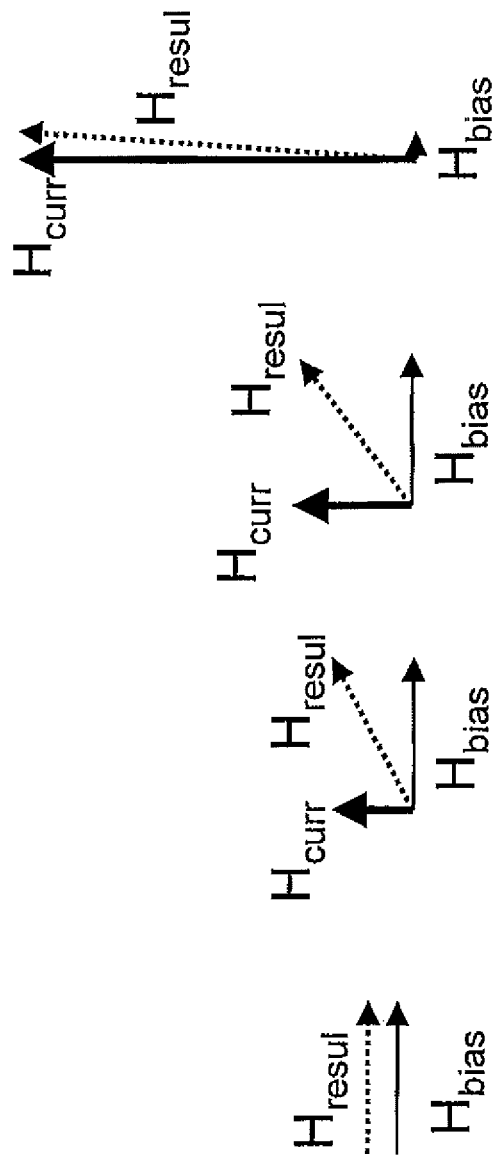

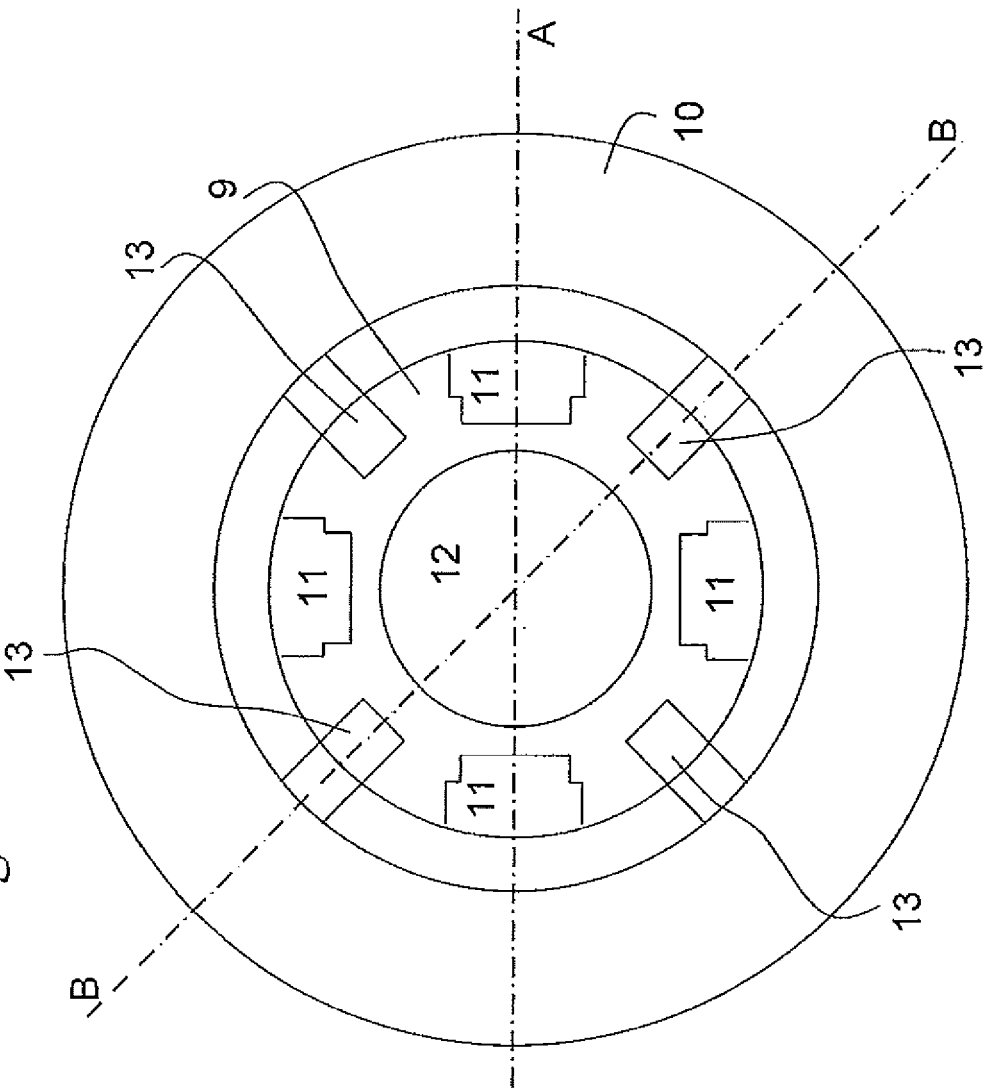

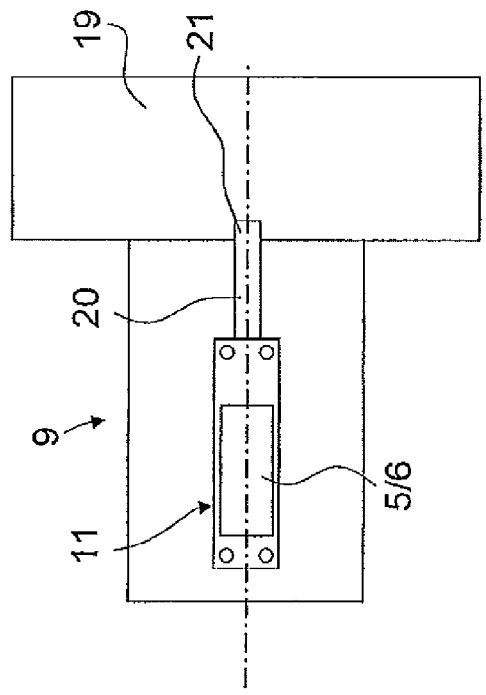
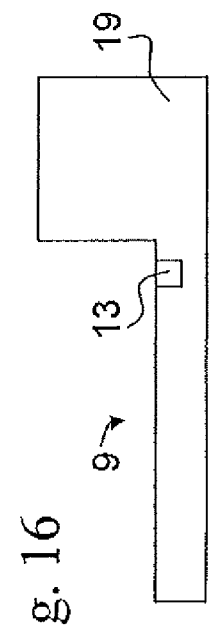
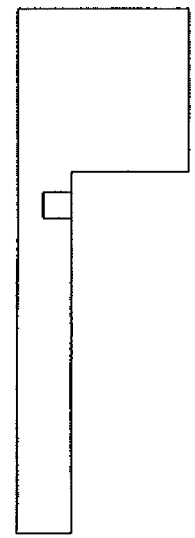
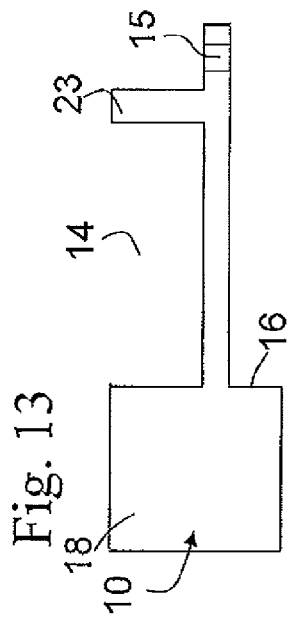
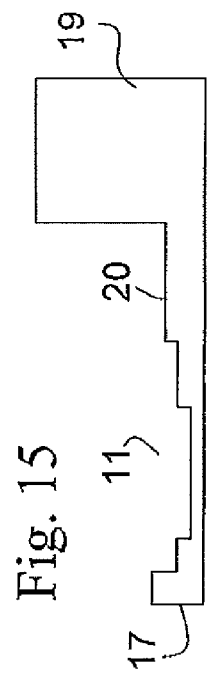
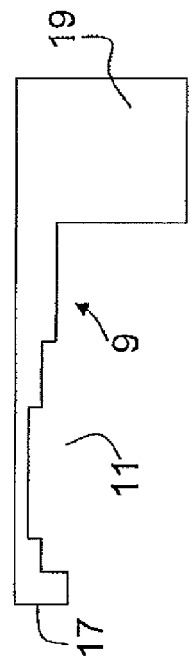

MAGNETORESISTIVE SENSOR ARRANGEMENT FOR CURRENT MEASUREMENT

TECHNICAL FIELD

The current invention pertains to a sensor unit for the measurement of a current in a conductor comprising at least one magnetoresistive sensor as well as to uses of such a sensor unit and to a method of current measurement using such a sensor unit.

BACKGROUND OF THE INVENTION

The measurement of small current signals on top of or after high current peaks is a challenging experimental task. Usually three different types of measurement techniques are employed to solve this problem:

1) The first measurement principle is based on the integration of an additional resistance into the circuit, a so called shunt resistor, such that the current which is to be measured (main current) flows through it. The current is then directly obtained from the voltage drop across this additional resistance.

However, there are difficulties associated with this measurement technique. On one hand the resistance has to be chosen such that it does not influence the circuit and thus has to be much smaller than all the other resistances. Also, during the peak current it is not allowed to heat up as this would generally change its characteristics. With this, the voltage drop becomes very small for small currents after the peak and the accuracy of the measurement decreases. Small variations on top of a large current can also not be resolved for the same reason, as they only cause small variations in the voltage drop.

2) The second measurement technique relies on the detection of the change in the magnetic field generated by the change in the current. Different techniques can be applied for this purpose. The most widely used technique bases on a coil that is placed around the current carrying cable. Changes in the magnetic field induce a voltage in the coil which can be directly measured. This signal has to be integrated in order to obtain the current signal itself.

The integration adds up the errors of each individual measurement resulting in an offset of the current signal. Hence, after a large current peak small currents cannot be measured accurately due to the offset in the signal. On top of a large current, small but fast changes can be measured with this technique. However, slow changes, e.g. drifts or variations of peak voltage, cannot be measured accurately. In order to reach high accuracy with this technique very small changes of the magnetic field have to be detected with a high bandwidth. This can either be realized by using a large number of windings for the coil which limits the bandwidth to low values only or by adding a ferromagnetic core to the coil in order to enhance the magnetic field and thus the signal. The difficulty with the ferromagnetic core is that high magnetic fields will magnetize the material and will thus lead to a distortion of the measured signal and to additional offsets due to hysteresis effects.

3) A far more elegant way is to measure the magnetic field directly instead of its change. With this, the problem with the integration offsets is avoided. However, as the magnetic fields generated by small current are small, the sensitivity is usually increased by employing magnetic materials. Thus, still offsets will be present due to hysteresis effects in these materials.

A further approach for the measurement of currents is by using magnetic field sensors with high sensitivity, as for example magnetoresistive sensor elements. As for example disclosed in U.S. Pat. No. 5,708,407 it is possible to use a circular current sensor based on a magnetoresistive material through which the conductor of the currents to be measured is guided. WO 2006/042839 discloses an improvement of such a device in that hysteresis or offset problems are said to be overcome by applying a pulsed additional magnetic field in the region of the sensor prior to the actual measurement process.

SUMMARY OF THE INVENTION

The object of the present invention is therefore to provide a sensor unit for current measurements, in particular for highly sensitive current measurements of small variations in the presence of large maximum peaks of the current to be measured. It shall be suited for the measurement of AC as well as of DC currents in this regime.

The present invention solves the above problem by providing a sensor unit for the measurement of a current in a conductor comprising at least one magnetoresistive sensor located at a radial distance from the outer surface of the conductor. In the set up the conductor, which may be part of the sensor unit as such which may however also be just surrounded by the sensor unit, has a circular cross-section providing a rotationally symmetric magnetic field to be measured. The circular cross-section should be as accurately circular as possible. Variations in the radius should be below 5%, preferably below 2%, most preferably below 1% and ideally below 0.1%. The sensor unit further comprises at least one auxiliary coil for the generation of a bias magnetic field $H_{bias}$. The auxiliary coil is located such as to apply this bias magnetic field to the magnetoresistive sensor in a manner that it is strong enough at the position of the sensor for inducing magnetic saturation in the magnetoresistive sensor. The applied bias field should be as homogeneous as possible in the sensing region of the magnetoresistive sensor, and the auxiliary coil is a dimension and designed to be suitable for applying this bias magnetic field is not just before the measurement process in a pulsed manner but for applying the bias magnetic field continuously during the whole current measurement process, so typically over a time span of at least 30 ins, preferably over a timespan of at least 100 ms, and normally the bias magnetic field is applied all the time so for more than a minute or an hour or several hours just as long as the device is turned on.

One of the key elements of the sensor unit according to the invention is the fact that it has been found that a magnetoresistive sensor can continuously be operated in the saturation regime by applying a corresponding bias field, which essentially eliminates offset and hysteresis problems associated with conventional operation of such sensors. It is furthermore astonishingly efficiently possible to use the angular dependency of the measurement signal in the sensor produced by the vector sum $H_{resul}$ of the field of the current to be measured $H_{curr}$ and the bias field $H_{bias}$. Typically to this end the direction of the bias magnetic field $H_{bias}$ provided by the auxiliary coil is oriented at an angle of more than 45°, preferably at an angle of more than 60°, most preferably at an angle of in the range of 80-100° with respect to the direction of the magnetic field $H_{curr}$ produced by the current in the conductor to provide a high angular sensitivity of the measurement signal. Magnetoresistive sensors have two stable magnetizations. One of these is addressed by the bias field. However, if the tilt angle is larger than a few degrees in the wrong direction, then the magnetic field corresponding to the peak current will flip the magnetization of the material and thus invert the signal. When using two sensors in the device one of the sensors will, if the bias field is tilted, automatically have a tilt into the wrong direction and the other will not. This is leading to a signal which can not be interpreted unambiguously any more. Therefore preferably the above angle is in the range of 90°+/−2°.

So a new measurement device based on magnetoresistive sensors is proposed in order to overcome the difficulties for the detection of small current signals on top or after large current peaks. The new method directly measures the magnetic field generated by the main current. It allows the detection of frequencies up to 1 MHz without showing any significant distortions of the signal due to the large currents, and especially without creating an offset during or after the measurements.

The aim for the realization of this device is to measure the magnetic field that is generated by a current with a high resolution in a relatively small range. With the standard techniques the main measurement difficulties arise due to saturation effects of the applied magnetic media. In saturation the sensitivity to the magnitude of the magnetic field is strongly reduced and due to hysteresis-effects an offset is created.

One inventive idea is thus to use a magnetic material which is kept in saturation during the whole measurement process and to measure the angle of the magnetic field instead of its magnitude. Magneto-resistive sensors are highly sensitive to the angle of an external magnetic field with respect to a probe current that is sent trough them and thus are ideally suited for the above mentioned task. To keep the material in saturation the additional bias magnetic field is generated and adjusted to be preferably essentially perpendicular to the main magnetic field created by the main current. With this, a change of the magnitude of the main magnetic field results in a change of the angle of the total magnetic field.

According to a preferred embodiment the auxiliary coil is provided as one multiturn winding around the axis of the conductor located outside of the at least one magnetoresistive sensor. So the auxiliary coil is coaxial with the conductor and the sensors are sandwiched between the conductor and the windings of the auxiliary coil. Like this the auxiliary coil can provide a strong and at the position of the sensor very homogeneous magnetic bias field which is perpendicular to the direction of the magnetic field that is to be measured, as the magnetic field to be measured is circumferential to the conductor. Furthermore in this setup the sensors can be located as close as possible to the conductor where the magnetic field to be measured is strongest, and the auxiliary coil provides a bias magnetic field with also a rotationally symmetric characteristics as the field to be measured.

According to a further preferred embodiment, at least one pair of magnetoresistive sensors (typically located opposite with respect to the main axis of the conductor), preferably at least two or three pairs of magnetoresistive sensors are distributed symmetrically around the circumference of the conductor. The provision of at least a pair of sensors allows to compensate for external field contributions quite efficiently. Indeed typically external field contributions are essentially homogeneous on the dimensional scale of the sensor, which therefore in view of the rotationally symmetric setup in particular in case of an auxiliary coil coaxial with the conductor allows a cancelling of the external field contributions when summing up the signals of the pairs of sensors. Preferably the sensors are located as close as possible to the conductor where the field of the conductor is strongest, so normally at a distance in the range of 0-10 mm, preferably 0-5 mm, as concerns their sensing region, from the outer surface of the conductor. The minimal distance is given by the required dielectric isolation between the conductor and the sensors, and is often at least 2-3 mm.

According to another preferred embodiment the magnetoresistive sensor is of the type to be driven with a probe current ($I_{probe}$) which is essentially at an angle of 45° with respect to the direction of the bias magnetic field $H_{bias}$, and preferably a sensor with a four element Wheatstone arrangement is used. Possible is for example the use of a type similar or equal to as available from NXP Semiconductors (Switzerland) with the designation magnetoresistive sensor KMZ.

More specifically, according to a further preferred embodiment, such a sensor unit may comprise an isolating inner supporting element, preferably of essentially cylindrical shape, enclosing the conductor (non-conducting mount). Such an isolating inner supporting element on its outer surface or at least partially embedded therein (for example in corresponding cavities or recesses) carrying at least one magnetoresistive sensor. Particularly low interference of the connections to the sensors can be achieved if in this context preferably the electrical connections to the sensor are when coming from the sensor first axially (for example over a distance of at least 5 mm) and subsequently radially guided away from the sensor (for example in correspondingly provided channels or recesses in the isolating inner supporting element). Further preferably an outer supporting element is provided. Also this outer supporting element can be of essentially cylindrical shape and is radially enclosing the inner element and the sensors located thereon/therein (essentially sandwiching the sensors between the inner and the outer supporting element). It is preferred if on the outer element's outer circumference or at least partially embedded into its outer circumference it carries the auxiliary coil, preferably as a multiturn winding around and coaxial with the axis of the conductor at the position where the sensors are located. Typically the inner supporting element and/or the outer supporting element are made of fluorinated materials, for example selected from PTFE and chemical modifications/blends thereof. Since in particular in case of AC measurements there can be heavy mechanical stress on the sensor unit, it is preferred if the winding of the auxiliary coil is firmly fixed to the sensor unit, which, according to a further preferred embodiment, it is possible if the multiturn winding is resin cast onto or into the outer supporting element. To this end for example of the outer supporting element can be provided with a corresponding outer circumferential recess into which the multiturn winding can be laid and subsequently fixed by filling the recess with a resin or a corresponding fixation material.

For measuring small variations of current on top of a large current one or several additional coils can be used that compensates the magnetic field generated by the large current. This way the resulting magnetic field seen by the magnetoresistive sensor is close to zero (at any absolute value of the current at which the measurement sensitivity should be high) and the sensor is sensitive. An additional constant current source can be provided to generate this compensation or subtraction magnetic field. It is also possible to automatically adjust the compensation field to the low frequency component of the main current. The overall magnitude of the current is then obtained from the required compensation field and the small variations are taken from the sensor directly.

Correspondingly therefore according to a further preferred embodiment of the sensor unit according to the invention, it comprises an additional coil for the generation of a subtraction magnetic field for the magnetic field ($H_{curr}$) induced by the current in the conductor. To this end normally the one or several additional coils are arranged such that the generated field at the sensing position of the magnetoresistive sensor is essentially opposite in direction to the magnetic field induced by the current in the conductor.

It is preferred that the sensor adapted for the measurement of currents in the conductor of for example up to 100 kA with a measurement range of for example +/−300 A around the zero value of the magnetic field ($H_{curr}$) induced by the current in the conductor, is eventually corrected for compensation with an additional coil.

To increase the sensitivity a further electronic-component can be implemented: the voltage source that drives the probe current through the sensor is actively stabilized in order to keep it as constant as possible and also the current that generates the bias magnetic filed is actively stabilized to keep the reference field constant.

Correspondingly therefore is preferred if the auxiliary coil is designed and located such as to produce a magnetic bias field ($H_{bias}$) at the position of the at least one sensor such that it keeps the sensor in saturation but not below. If the field is too small, the function of the sensor can not be guaranteed and for very high peaks it will fail. Thus the field should normally be at least 3.75 mT. It can have any value that is larger, however, the sensitivity of the sensor is directly related to the strength of this field and is reduced with increasing field. Thus, preferably the smallest necessary value should be used, that keeps the sensor in saturation but not below. Correspondingly it is preferably chosen to be of at least 3.5 mT, most preferably of at least 3.75 mT. It is preferably adapted not to be larger than 4 or 5 mT. Further preferably the magnetic bias field ($H_{bias}$) is controlled to vary in the range of less than 0.1% preferably in the range of less than 0.01%.

According to a further preferred embodiment of the sensor unit according to the present invention, it further comprises an electronics unit for controlling the magnetoresistive sensors and for feeding the at least one auxiliary coil and for amplifying and/or evaluating the signals of the magnetoresistive sensors. It should be noted that the available sensitivity of the sensor unit is very high and therefore care has to be taken that no "magnetic noise or interference signal" is produced by the lines leading to or from the sensors and/or by the electronics unit. One means to keep interfering signals as low as possible in the above-mentioned way of first axially and subsequently radially guiding away the lines to and from the sensors. Another additional possibility is to avoid the noise induced by transformers for powering the electronics unit. To this end one may either use a completely or heavily shielded transformer or, as preferred, it is possible to use an electronics unit which is essentially exclusively powered by the use of at least one battery unit (e.g. rechargeable). Furthermore it is advisable to make sure that the electronics unit is built of components of low magnetic and/or electric field noise producing components.

Furthermore the present invention relates to a specific use of a sensor as described above. This use is characterised in that the sensor is used for the measurement of currents in a conductor, preferably of small variations and/or of decay characteristics of the current in the presence of high peak current values in the range of up to 50 kA preferably of up to 100 kA with a sensitivity in the range of +/−300 A. It is further preferred to use the sensor unit with an additional coil for the generation of a subtraction magnetic field for the magnetic field ($H_{curr}$) induced by the current in the conductor for the measurement of essentially direct currents in a conductor with a very high sensitivity in the presence of high absolute current values.

Such a use of a sensor preferably takes place with an additional coil for the generation of a time independent subtraction magnetic field for the compensation of the magnetic field ($H_{curr}$) induced by a specific current in the conductor for the precise measurement of currents close to this specific current. Applications of this use are in particular the measurement of variations in DC currents, variations in peak currents of a 50 Hz signal by compensating the expected/averaged peak value, precise measurement around a specific current level, e.g. the activation current of a fuse.

Such a use of a sensor further preferably takes place with an additional coil for the generation of a time dependent subtraction magnetic field aiming to keep the resulting field within the sensitivity range of the sensor allowing for a precise measurement of the difference between the compensation field and the resulting one. The compensation field can be generated e.g. by using a feedback mechanism, a low-frequency current measurement, or a predefined waveform. Applications of this use are in particular the detection of small variations/harmonics on a 50 Hz signal by compensating for a perfect sinusoidal signal of the correct amplitude (which might be adjusted with a feed back or low frequency measurement), precise measurement of deviation from any expected current waveform, measurement of any current by compensating as well as possible using a feed back, where the feed back signal is a measure for the current.

Furthermore the present invention relates to a method for measuring the current in a conductor preferably with a sensor unit as outlined above, wherein the auxiliary coil is continuously and during the whole current measurement process fed with a current sufficient for inducing magnetic saturation in the magnetoresistive sensor, and wherein the bias magnetic field is oriented essentially perpendicular to the magnetic field that is to be measured.

Further embodiments of the present invention are outlined in the dependent claims.

SHORT DESCRIPTION OF THE FIGURES

In the accompanying drawings preferred embodiments of the invention are shown in which:

FIG. 1-4 are schematic representation for the magnetic field vectors in situations where a bias magnetic field is applied, wherein in FIG. 1 no current is flowing in the conductor, in FIG. 2 a small current is flowing in the conductor, in FIG. 3 a medium current is flowing in the conductor and in FIG. 4 a large current is flowing in the conductor and the representation is scaled in the direction of the bias magnetic field to indicate the limit situation;

FIG. 5 gives the vector representation of the angle α enclosed by the direction of the probe current and the field to be measured;

FIG. 6 gives the resistance measured in the magnetoresistive sensor at the function of the angle α;

FIGS. 7 and 8 same as FIGS. 5 and 6 respectively, however the direction of the probe current is tilted by 45', which results in a linear response around α=0;

FIG. 9 schematic perspective view onto a measurement set up with two sensors and a coil for the generation of the bias magnetic field;

FIG. 10 a cut perpendicular to the axis of the conductor through a sensor according to FIG. 9 and the fields acting on the two sensors; and FIG. 11 shows a vector diagram of the situations of the magnetic fields and the probe current in the two sensors according to FIGS. 9 and 10 if viewed along the arrow in FIG. 10 from the top or equally on the rotation of 180° from the bottom;

FIG. 12 shows a cut perpendicular to the main axis of the conductor and equally of the sensor unit;

FIG. 13 shows an axial cut through the outer supporting element of the sensor unit;

FIG. 14 shows a view onto the inner supporting element of the sensor unit;

FIG. 15 shows an axial cut through the inner supporting element along the line A-A in FIG. 12; and FIG. 16 shows an axial cut through the inner supporting element along the line B-B in FIG. 12.

DETAILED DESCRIPTION OF THE PREFERRED EMBODIMENTS

Figure 6:
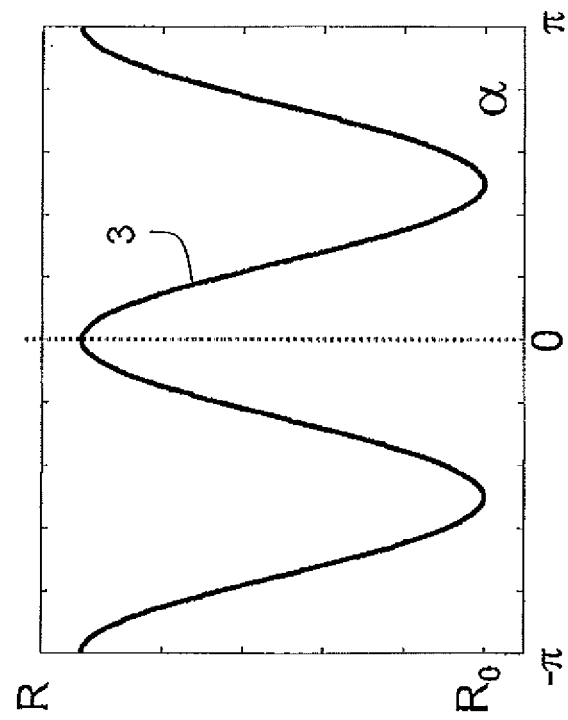

A magneto-resistive element used in a magnetoresistive sensor is an object that changes its resistance as a function of the direction of its magnetization with respect to a small probe current that is sent through the element. The resistance depends approximately on the cosine-square of the angle between this probe current and the magnetization of the material. If the current and the magnetization point into the same direction the resistance will be maximal. If the angle between the current and the magnetization is 90 degrees the resistance will be minimal. The device is mounted such that the probe current is tilted at 45 degrees with respect to a main magnetic field, which is to be measured, and a bias magnetic field is tilted another 45 degrees further at 90 degrees with respect to the main magnetic field. With this the resistance of the magneto-resistive element is sensitive to the main magnetic field up to the point where its magnitude is equal to the magnitude of the bias magnetic field. Thus, the sensitivity of the element is adjusted via the strength of the bias magnetic field. Furthermore, the zero point can be adjusted by adding an additional magnetic field in the opposite direction to the main magnetic field. With this, the sensor shows a zero signal if the main magnetic field exactly cancels the additional magnetic field.

Referring to the drawings, which are for the purpose of illustrating the present preferred embodiments of the invention and not for the purpose of limiting the same, FIG. 1-4 correspondingly shows several vector diagrams for the situation where a magnetoresistive sensor is exposed to a bias magnetic field $H_{bias}$ (always solid thin line arrow) which saturates the magnetisation of the sensor. If, as illustrated in FIG. 1, no current flows through the conductor, there is no generation of a corresponding magnetic field $H_{curr}$ which circulates around the conductor. In this situation therefore, all the magnetisation acting on the sensor $H_{resul}$ is given by $H_{bias}$. If a low current is flowing through the conductor, a situation results as illustrated in FIG. 2. The resulting magnetic field $H_{resul}$ acting on the sensor and correspondingly determining the sensor signal is given by the vector sum of $H_{curr}$ and $H_{bias}$. For an even stronger current the situation is illustrated in FIG. 3. From comparison of the two FIG. 2 and FIG. 3 one can see that for small currents (small meaning that the resulting $H_{curr}$ is in the range of or smaller than $H_{bias}$) one has a strong angular dependence of the resulting magnetic field $H_{resul}$ on the sensor. In FIG. 4 the situation for a high current flowing through the conductor is illustrated. In this situation the angle between $H_{bias}$ and $H_{resul}$ (designated as α) approaches 90°. So generally for values above 45° the sensor sensitivity is low if not essentially zero. Also, the sensor signal for an angle α is identical to the signal for the smaller current corresponding to angle 90°−α. So this particular setup is for example especially suitable for situations where the low Ampere decay characteristics after the presence of a high current peak is to be analysed. The proposed setup allows measurement without delay or hysteresis effects. So this particular setup is for example especially suitable for situations where a current sensor in a circuit is needed that is not affected by high peak-currents (e.g. short circuits up to 100 kA) and keeps its calibration without any significant distortion of the signal immediately after the disturbance. The proposed setup allows a precise measurement of the current without delay or hysteresis effects. With sensor units according to the state-of-the-art one usually has a maximum sensitivity of several percent of the peak value of the current (which in the above example would be in the range of several 100 A) or takes a long time to recover from the disturbance. Since the new sensor however is free of hysteresis and delay effects, independent of how high the current peak is, one always reaches the same resolution of below 0.1 A and one can accurately measure in the above situation.

Figure 5:
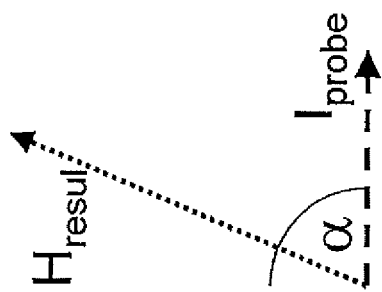

The resistance of the probe depends on the angle between a probe current in the sensor and the magnetisation of the sensor material, which again is given by the direction of the external field. This relative arrangement of the probe current $I_{curr}$ and the field to be measured $H_{resul}$ and the enclosed angle is illustrated in FIG. 5. The functional relationship 3 between the measured resistance in the sensor as a function of this angle α is illustrated in FIG. 6. The functional relationship in this case is as follows:

$$R=R_0+R_1(\cos(\alpha))^2.$$

The problem in this geometrical arrangement of the probe current and the magnetic field to be measured is the fact that around the most interesting region, i.e. around values of the angle in the range of zero, the sensitivity to the angle is low and there is a non-linear relationship. Furthermore it is not possible to distinguish between positive and negative values of the angle.

Figure 7:
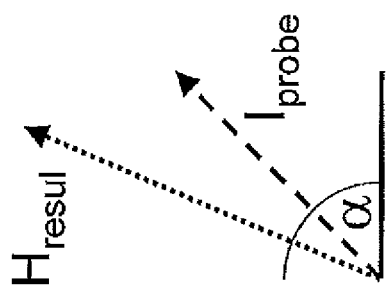

Correspondingly therefore it is proposed to tilt the probe current $I_{probe}$ in the sensor by 45° as illustrated in FIG. 7 which essentially shifts the above function by π/4 and the output signal becomes linear with respect to the angle for small angles and the higher sensitivity is reached:

$$R=R_0+R_1(\cos(\alpha-\pi/4))^2=R_0+R_1/2+R_1/2\sin(2\alpha).$$

Figure 8:
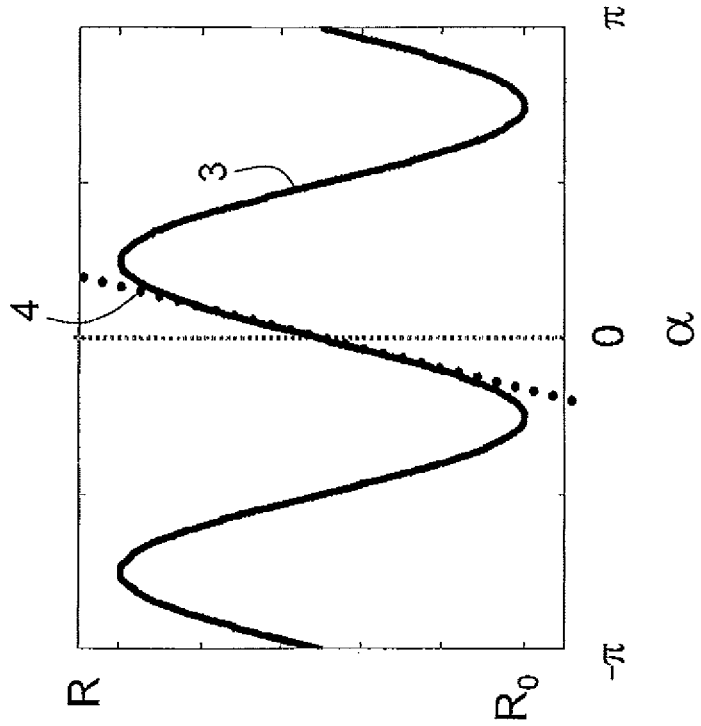

The situation is illustrated in FIG. 8, and the linear approximation is illustrated with the dotted line 4. Indeed in such a mode of operation values of α in the range of +/−45° can be measured using the full functional relationship, and a range by a factor of two or three smaller using the linear approximation. How large this measurement window actually is of course depends on the amplitude of the bias magnetic field, since however the bias magnetic field must at least be strong enough to saturates the sensor, this leads to a minimum range of sensitivity equaling the above +/−45° of +/−300 A. For the linear regime the corresponding window is approximately +/−100 A. These values apply for sensors that are located according to the present state of the art in which four sensors are forming one individual sensor and these for sensors are connected as a Wheatstone bridge. Such types of sensors or for example available from NXP semiconductors under the type designation KMZ.

Thus, as the resistance R can be measures, the angle α can be calculated. From the known value of the bias magnetic field $H_{bias}$ the value of the magnetic field can be calculated by trigonometry. Further, as the magnetic field $H_{curr}$ is directly proportional to the current carried by the conductor 1, this current can be calculated from the known magnetic field $H_{curr}$. In order to receive accurate measurements the sensor unit as described below should be calibrated.

Figure 9:
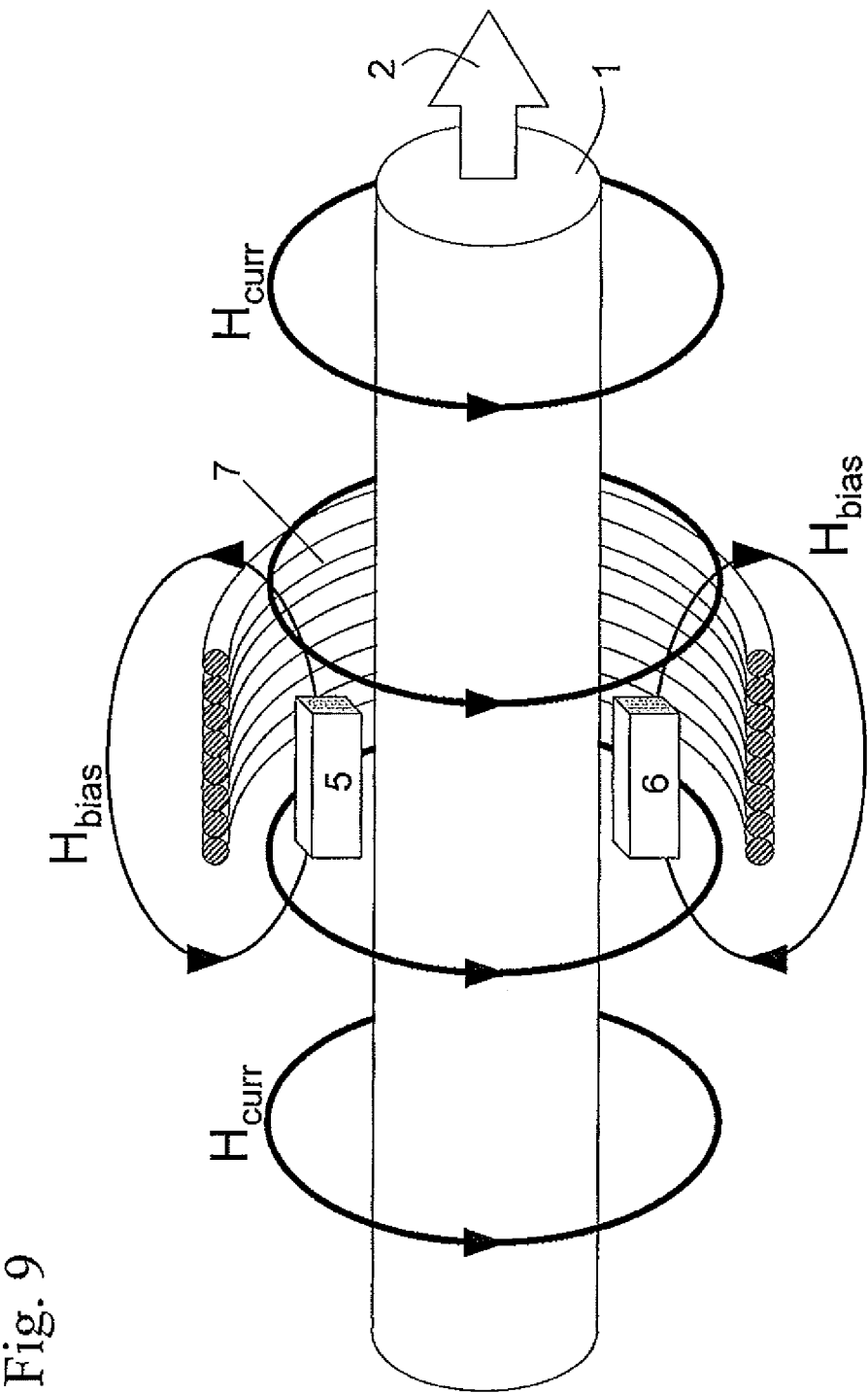

A specific sensor setup is illustrated in FIG. 9 in a schematic prospective view. In this specific case the single conductor 1 with high accuracy circular cross-section carries a current as indicated by the arrow 2. In the set up used for experimental testing the conductor had a diameter of 20 mm and was specified for currents up to 100 kA. This current may either be AC or DC, if one or several additional coils are present for the compensation of the field generated by the DC current. If flowing in the direction as indicated by the arrow 2, it induces a rotationally symmetric circumferential magnetic field as illustrated by the solid thick arrows $H_{curr}$. The sensor unit comprises an upper magnetoresistive sensor 5 and a lower magnetoresistive sensor 6. Each of these sensors is for example of the above type KMZ. So each magneto-resistive sensor 5, 6 is build up with four magneto-resistive elements which constitute a Wheatstone bridge in order to maximize the signal obtained from the elements.

The sensors 5, 6 are located as exactly as possible opposite to and symmetrically to the conductor, and they are connected and driven in a rotationally equivalent way. The sensors 5, 6 are located as close as possible to the outer surface of the conductor, typically the distance between the sensing region of the sensors 5, 6 and the outer surface of the conductor is in the range of a 4-5 mm.

Around the conductor 1 and also enclosing the two sensors 5, 6 there is provided an auxiliary coil 7. This multiturn winding if fed with the corresponding current induces a bias magnetic field $H_{bias}$ at the position of the sensors 5, 6 which is essentially perpendicular to the field $H_{curr}$ to be measured. The distance of the innermost windings of the auxiliary coil 7 from the outer surface of the conductor in the set up used here was around 12-15 mm. Generally one can say that the minimum field which this auxiliary coil 7 have to be able to generate at the position of the sensors 5, 6 is a field which is sufficient for saturating the sensor. Typically this means that a magnetic field of at least 3.5 mT, preferably of at least 3.75 mT (also depends on the used sensor and the magnetic material inside) must be generated at the sensor position. Furthermore the coil must be dimensioned not just for pulsed short time field generation but for essentially continuous field generation in this strength range. The field is to be applied during the actual measurement process, so since the above-mentioned processes take place in the range of several tens of ms, a field of the above strength must be provided for at least 30 ms, preferably at least 50 ms, and normally just for as long as the sensor head is operated, so for hours or even more.

Figure 10:
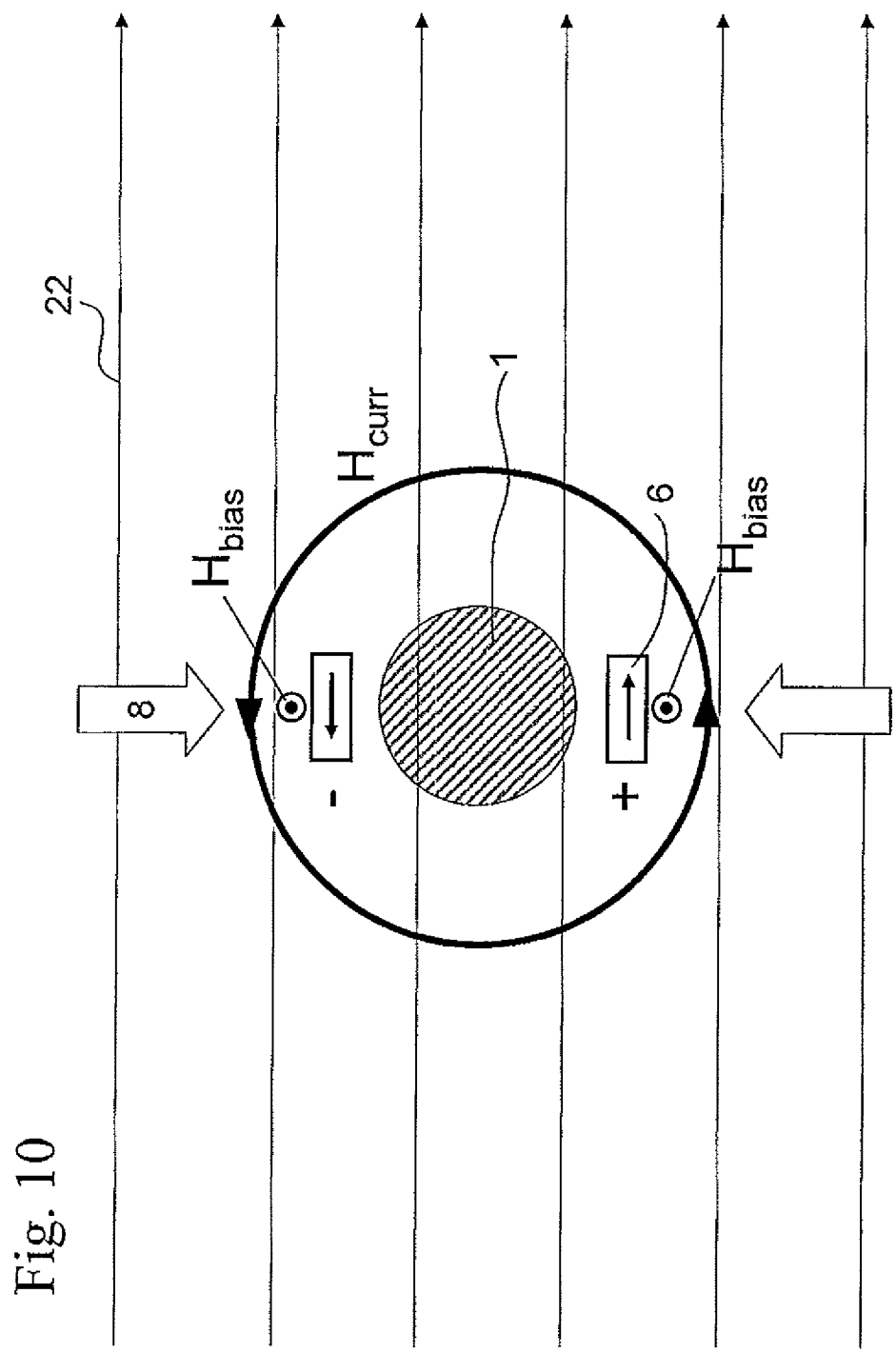

The general situation according to FIG. 9 is illustrated in FIG. 10 in an axial cut viewed in a direction opposite to the arrow in FIG. 9. One here sees that indeed the field to be measured $H_{curr}$, also indicated by the small arrows within the sensors, is perpendicular to the biasing field $H_{bias}$. In addition in FIG. 10 a general external magnetic field contribution indicated with reference 22 is schematically indicated. Typically one notes that such external magnetic field contributions, within the dimensional framework of the sensor unit, are essentially homogeneous as concerns amplitude and direction. Correspondingly as one can see by the corresponding + and − signs given, due to the rotationally symmetric arrangement of the two sensors 5, 6 contributions of this external magnetic field 22 are cancelled when taking the sum of the measurement signals of the two sensors. As there can still be differences in the general sensitivity of individuals sensors as well as geometrical differences, this sum is preferably an adjustable weighted sum the waiting of which can be adapted under standard situations.

To further clarify the relative orientation of the various vectors in the proposed setup, the conditions in the other sensor view according to the arrow in FIG. 10 is illustrated in FIG. 11. One can recognize that indeed the field induced by the current $H_{curr}$ is perpendicular to the bias field $H_{bias}$, and that the probe current is essentially at 45° to these two directions. It is to be noted that the same vectorial situation results if one rotates the set up as given in FIG. 10 around the main axis of the conductor and views the lower sensor 6, now in the upper position, along the arrow.

The specifics of the possible realisation of such a sensor unit are illustrated in FIG. 12-16. The setup, with reference to FIG. 12, comprises an inner supporting element or inner cylinder 9, typically of PTFE, which comprises a central axial bore 12, into which the conductor 1 can be inserted. On its outer surface this inner cylinder 9 comprises, in this case where four sensors are to be used, four equally distributed recesses 11 into which the sensors can be put and eventually fastened therein. Furthermore the unit comprises an outer supporting element or outer cylinder 10, located outside of the inner cylinder and enclosing it. The outer cylinder 10 can be shifted over the inner cylinder 9 once the sensors are located in the recesses 11, and subsequently the sensors are sandwiched between the inner and the outer cylinder and firmly held in the setup. The inner cylinder 9 and the outer cylinder 10 can then be tightly connected by using radial screws penetrating through bores as visible in FIG. 13 and engaging into corresponding bores 13 in the inner cylinder 9 as visible in FIG. 12 or in FIG. 16.

In FIG. 13 an axial cut of the outer cylinder 10 only is given. The outer cylinder 10 in the left portion comprises a central bore through which the conductor penetrates. In this region also the terminal flange 18 is provided. To the right thereof there is provided recess 14 in the outer surface, into this recess the multiturn winding for the auxiliary coil 7 and be laid and firmly fixed therein for example by filling with a resin and cross-linking/polymerizing it. In this right portion the inner diameter of the central bore is larger and in the transition region between the two inner diameters an abutment surface 16 is provided. Indeed if the inner cylinder 9, as illustrated in FIG. 15 in an axial cut, is equipped with the sensors the outer cylinder 10 is shifted on to the inner cylinder until the surface 17 of the inner cylinder abuts with the surface 16 of the outer cylinder. In the final set up correspondingly the left side of the sensor unit is formed by the flange 18, followed to the right by the outside of the auxiliary winding located in the recess 14, then follows a thin additional flange 23 of the outer cylinder 10 and a recess into which the above-mentioned screws can be put to penetrate through the holes 15 and to engage with the blind holes 13 of the inner cylinder 9 as illustrated in FIG. 16. To the right side the sensor unit is then bordered by terminal flange 19 of the inner cylinder (see FIGS. 14 and 16). A very compact and clearly defined sensor unit is therefore provided.

In FIG. 14 a side view of the inner cylinder is given. In this illustration 1 can see that the sensor 5/6 is located in the recess 11. The connections to and from the sensor first axially guided away through axial channel 20 and subsequently radially guided out of the sensor head through channels 21. Likely is the disturbing influence of these cables onto the magnetoresistive sensors can be minimised.

To summarise, the sensor head is build up of a conducting rod 1, a non-conducting mount 9,10, two or an even number of magneto-resistive sensors 5,6, an auxiliary coil 7, and if needed one or several additional coils (not illustrated in the figures). The conducting cylindrical rod 1 is needed to pass the main current through the sensor head.

The non-conducting mount 9,10 separates the magneto-resistive sensors 5, 6 from the rod and thus isolates them from the main circuit. Furthermore, it fixes the auxiliary coil 7 with respect to the magneto-resistive sensors 5, 6 and allows for a precise adjustment of the sensor head.

The magneto-resistive sensors 5, 6 are located at a well defined distance from the rod 1 and all pairs of sensors are facing each other on opposite sides of the current carrier 1. With this any homogeneous external fields are removed from the measurement and with every additional sensor pair the total sensitivity and the signal to noise ratio is increased.

The auxiliary coil 7 is needed to generate a homogeneous magnetic bias field and with it defines the range of sensitivity of the sensor.

The one or several additional coils allow to set the zero signal (reference signal) for the sensors. Such an additional coil can for example be located in the schematic illustration according to FIG. 11 as a multiturn winding around the sensor 5 with its principal axis collinear with the arrow indicating $H_{curr}$. The additional compensating or subtracting field of this additional coil is then co-directional with the direction of the field $H_{curr}$ to be measured and can be efficiently used for the compensation thereof, in particular in case of DC current measurements.

The current sensor consists of two, parts, the sensor head as discussed above, which detects the magnetic field, and an electronics unit, which provides the currents for the auxiliary field and/or subtracting field and amplifies (typically by around a factor of 10, in the described setup with 4 sensors the amplification is indeed about 10, or 2.5 per sensor) and processes the signals.

The electronics unit consists of two parts, one or two current sources and a signal processing unit. The current sources are responsible for constant currents through the auxiliary coil and/or additional coil and thus generate stable magnetic fields as a reference for the magneto-resistive sensors and define the zero signal of the sensor. The signal processing unit is needed to generate the supply voltage of the sensors and to amplify the signals from the individual magneto-resistive sensors and add them to a signal proportional to the current. As the sensitivities of the individual sensors are slightly different each signal is weighted accordingly.

LIST OF REFERENCE NUMERALS

1 conductor/rod conducting the currents to be measured
2 direction of current in 1
3 resistance measured in the magnetoresistive sensor as a function of angle $\alpha$
4 indication of the linear regime around the zero point
5 first magnetoresistive sensor
6 second magnetoresistive sensor
7 auxiliary coil for producing bias magnetic field
8 viewing direction
9 inner supporting element of the sensor unit, inner cylinder
10 outer supporting element of the sensor unit, outer cylinder
11 recesses for magnetoresistive sensors
12 bore in 9 for 1
13 bore in 9 for fixation screw
14 recess for auxiliary coil 7
15 through bore in 10 for fixation screw
16 abutment surface on the outer cylinder for inner cylinder
17 abutment surface on inner cylinder
18 terminal flange of outer cylinder
19 terminal flange of inner cylinder
20 axial recess in 9 for connections to 5/6
21 radial recess in 19 of 9 for connections to 516
22 external magnetic field contribution
23 flange $H_{curr}$ magnetic field generated by the current in 1 to be measured
$H_{bias}$ bias magnetic field
$H_{resul}$ resulting field from $H_{curr}$ and $H_{bias}$
$I_{probe}$ probe current in the magnetoresistive sensor
R resistance in the magnetoresistive sensor
$R_0$ minimum value of R in the magnetoresistive sensor as a function of the angle $\alpha$
$\alpha$ angle between the probe current and $H_{resul}$

The invention claimed is:

1. Sensor unit for the measurement of a current in a conductor comprising at least one magnetoresistive sensor located at a radial distance from the outer surface of the conductor, wherein the conductor has a circular cross-section, wherein the sensor unit comprises at least one auxiliary coil for the generation of a bias magnetic field ($H_{bias}$) to the at least one magnetoresistive sensor strong enough for inducing magnetic saturation in the at least one magnetoresistive sensor continuously during the whole current measurement process, wherein the magnetic field generated by the current in the conductor is directly measured by the at least one magnetoresistive sensor, wherein the direction of the bias magnetic field ($H_{bias}$) provided by the auxiliary coil is oriented at an angle of 88-92° with respect to the direction of the magnetic field ($H_{curr}$) produced by the current in the conductor, wherein the auxiliary coil is provided as one multiturn winding around and coaxial with the conductor, and wherein the at least one magnetoresistive sensor is sandwiched between the conductor and the windings of the auxiliary coil.

2. Sensor unit according to claim 1, wherein at least one pair of magnetoresistive sensors are distributed symmetrically around the circumference of the conductor such that the sensor sensing regions are disposed at a distance in the range of 0-10 mm from the outer surface of the conductor.

3. Sensor unit according to claim 1, wherein the at least one magnetoresistive sensor is driven with a probe current ($I_{probe}$) which is essentially at an angle of 45° with respect to the direction of the bias magnetic field ($H_{bias}$).

4. Sensor unit according to claim 1, wherein an isolating inner supporting element encloses the conductor and on an outer surface of the inner supporting element or at least partially embedded therein carrying at least one magnetoresistive sensor, wherein an outer supporting element radially encloses the inner element and the sensors located thereon/therein and on its outer circumference or at least partially embedded into its outer circumference carrying the auxiliary coil as a multiturn winding around the axis of the conductor at the position where the sensors are located.

5. Sensor unit according to claim 4, wherein the multiturn winding is resin cast onto or into the outer supporting element.

6. Sensor unit according to claim 1, comprising an additional coil for the generation of a subtraction magnetic field for the magnetic field ($H_{curr}$) induced by the current in the conductor.

7. Sensor unit according to claim 1, for the measurement of currents in the conductor up to 500 kA, with a measurement range of +/−300 A around the zero value of the magnetic field ($H_{curr}$) induced by the current in the conductor, including an additional coil configured to provide a compensating magnetic field.

8. Sensor unit according to claim 1, wherein the auxiliary coil is designed and located such as to produce a magnetic bias field ($H_{bias}$) at the position of the at least one sensor of at least 3.5 mT.

9. Sensor unit according to claim 1, further comprising an electronics unit for controlling the at least one magnetoresistive sensor and for feeding the at least one auxiliary coil and for amplifying and/or evaluating the signals of the at least one magnetoresistive sensor.

10. Sensor unit according to claim 1, wherein the auxiliary coil is designed and located such as to produce a magnetic bias field ($H_{bias}$) at the position of the at least one sensor of at least 3.5 mT and wherein further the magnetic bias field ($H_{bias}$) is controlled to vary over time in the range of less than 0.1%.

11. Sensor unit according to claim 1, further comprising an electronics unit for controlling the at least one magnetoresistive sensor and for feeding the at least one auxiliary coil and for amplifying and/or evaluating the signals of the at least one magnetoresistive sensor, wherein the electronics unit is exclusively powered by the use of at least one battery unit, and/or wherein it is built of low magnetic and/or electric fields noise components.

12. A method of measuring current in a conductor, comprising:
providing a sensor unit as recited in claim 1; and,
measuring the current in the conductor with the sensor unit.

13. The method of claim 12, further comprising:
measuring small variations and/or decay characteristics of the current in the presence of high peak current values in the range of up to 500 kA being sensitive in the range of +/−300 A.

14. The method of claim 12, further comprising:
providing an additional coil operatively arranged to generate a time independent subtraction magnetic field for the compensation of the magnetic field ($H_{curr}$) induced by a specific current in the conductor for the measurement of currents close to this specific current.

15. The method of claim 12, further comprising:
providing an additional coil operatively arranged to generate a time independent subtraction magnetic field for the compensation of the magnetic field ($H_{curr}$) induced by a specific current in the conductor for the measurement of essentially direct currents in a conductor.

16. The method of claim 12, further comprising:
providing an additional coil operatively arranged to generate a time independent subtraction magnetic field configured to maintain a resulting field within the sensitivity range of the sensor and allowing for a measurement of the difference between the compensation field and the resulting field, wherein the compensation field is generated by a feedback mechanism, a low-frequency current measurement, or a predefined waveform.

17. The method of claim 12, further comprising:
feeding a current sufficient for inducing magnetic saturation in the at least one magnetoresistive sensor to the auxiliary coil continuously during the current measurement process; and,
orienting the bias magnetic field essentially perpendicular to the magnetic field that is to be measured.

* * * * *